(12) United States Patent
Li et al.

(10) Patent No.: US 6,724,637 B2
(45) Date of Patent: Apr. 20, 2004

(54) APPARATUS AND METHOD FOR HARNESSING OPTICAL FIBER TO A CIRCUIT BOARD

(75) Inventors: Hong Li, Carol Stream, IL (US); Kenneth S. Laughlin, Arlington Heights, IL (US); Craig G. Mitchell, South Barrington, IL (US); Thomas C. Ruberto, Palatine, IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 10/621,219

(22) Filed: Jul. 16, 2003

(65) Prior Publication Data

US 2004/0017669 A1 Jan. 29, 2004

Related U.S. Application Data

(62) Division of application No. 10/001,103, filed on Nov. 2, 2001, now Pat. No. 6,621,714.

(51) Int. Cl.[7] .................................................. H05K 7/10
(52) U.S. Cl. ...................... 361/760; 361/720; 361/826; 361/825; 361/801; 174/191; 148/74.1; 148/74.2
(58) Field of Search ................................. 361/760, 825, 361/826, 723, 720, 736; 174/191; 248/74.3, 74.1, 74.2, 88

(56) References Cited

U.S. PATENT DOCUMENTS

| | | | | |
|---|---|---|---|---|
| 329,373 | A | * 10/1885 | Kaga | 432/200 |
| 3,432,129 | A | * 3/1969 | Santucci | 248/69 |
| 4,457,482 | A | 7/1984 | Kitagawa | 248/74.3 |
| 4,471,408 | A | 9/1984 | Martinez | 361/728 |
| 4,619,431 | A | * 10/1986 | Matsui et al. | 248/500 |
| 5,230,489 | A | * 7/1993 | White et al. | 248/74.2 |
| 6,034,874 | A | 3/2000 | Watanabe | 361/704 |
| 6,164,603 | A | 12/2000 | Kawai | 248/73 |
| 6,272,722 | B1 | 8/2001 | Lai | 24/458 |

* cited by examiner

Primary Examiner—David Martin
Assistant Examiner—Hung Bui
(74) Attorney, Agent, or Firm—Baniak Pine & Gannon

(57) ABSTRACT

An apparatus and method for retaining a length of fiber optic cable to a circuit board includes a body portion. The body portion of the apparatus includes at least a pair of spaced legs extending from the body portion, each of the legs is adapted to be received in a mounting opening formed in the PC board. Each of the spaced legs includes a foot portion adapted for securing the body to the circuit board and at least a pair of spaced arms extend from the body portion defining a slot between the arm and the body portion for receiving and retaining a portion of the length of fiber optic cable. The arms are spaced a distance from each other for retaining the fiber optic cable in an arc having a radius greater than a minimum bend radius of the fiber optic cable.

3 Claims, 3 Drawing Sheets

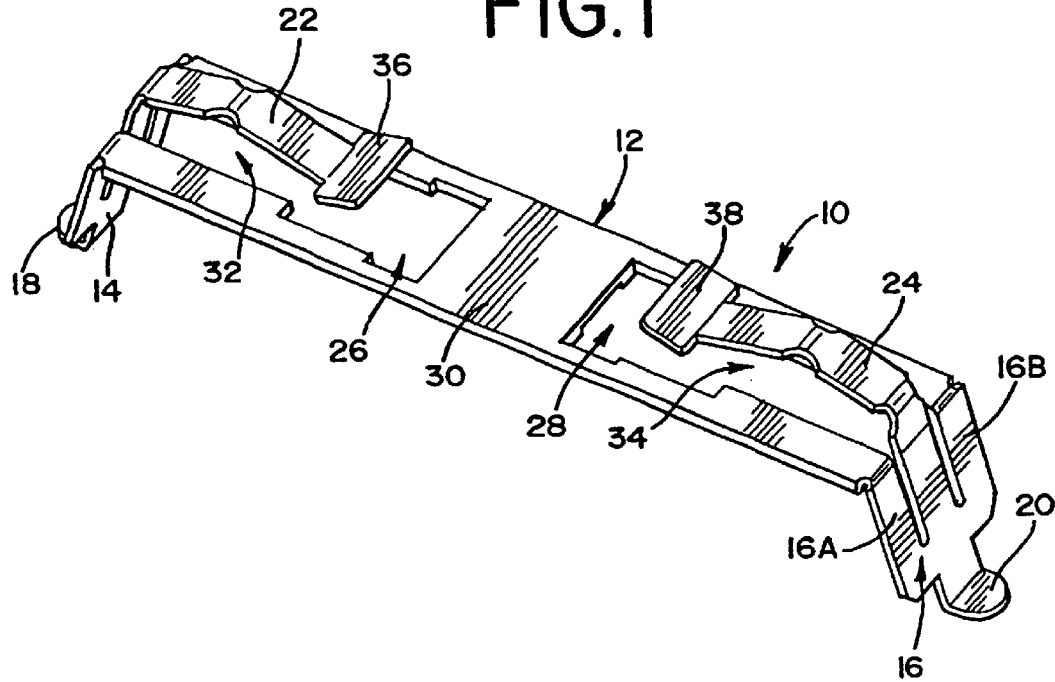
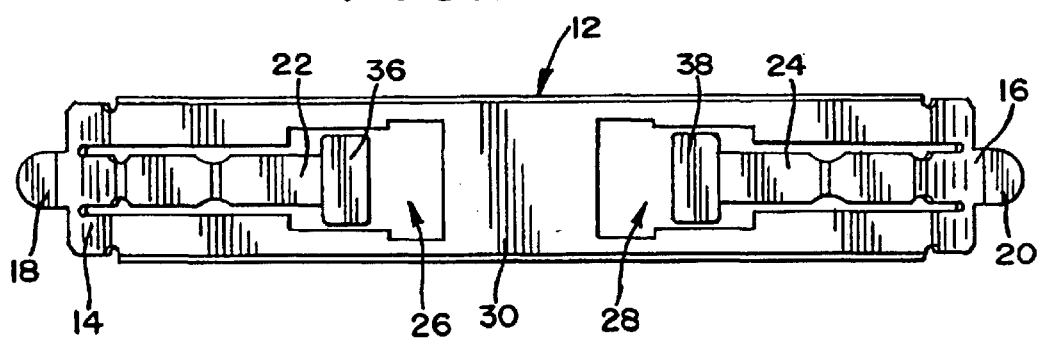

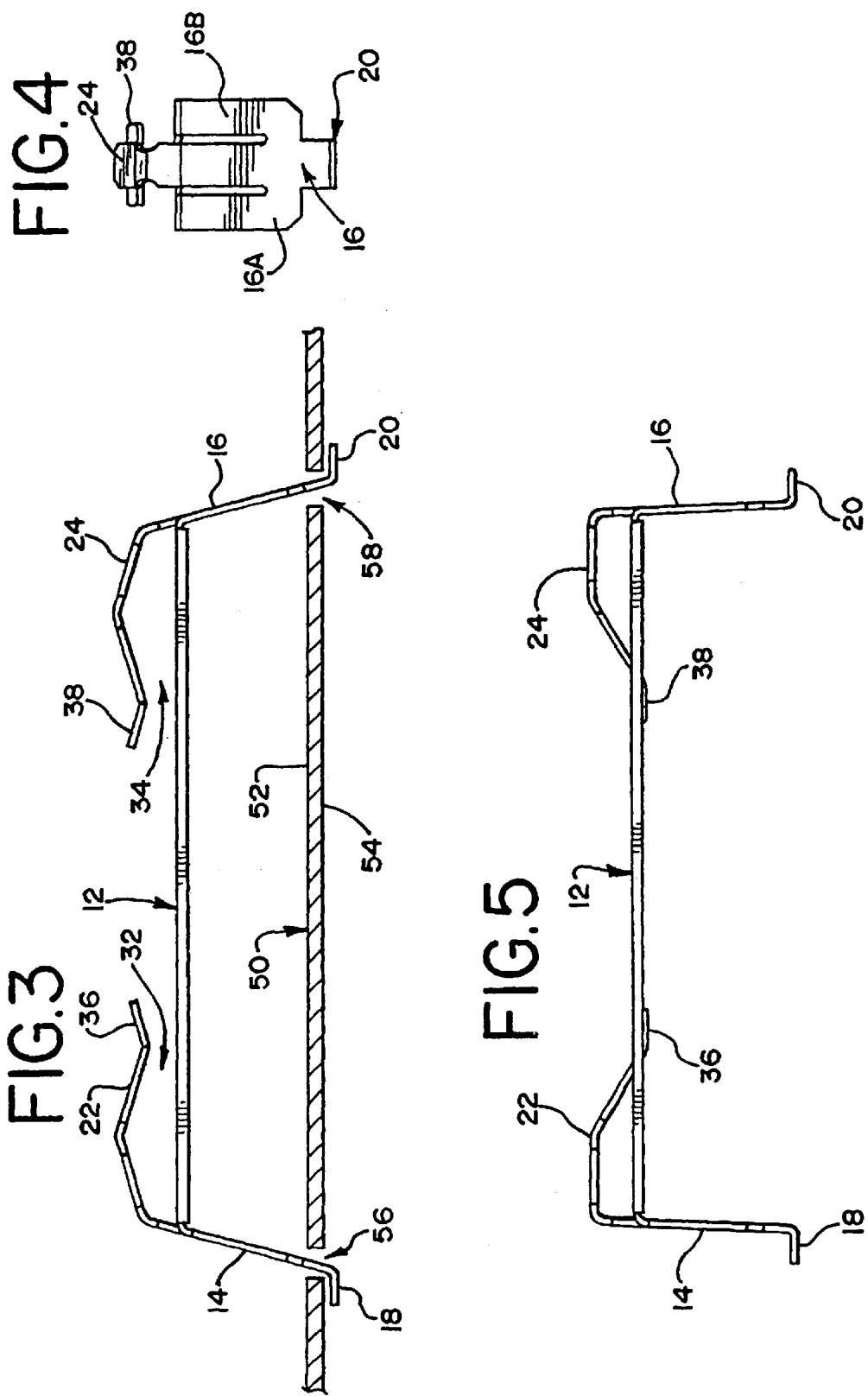

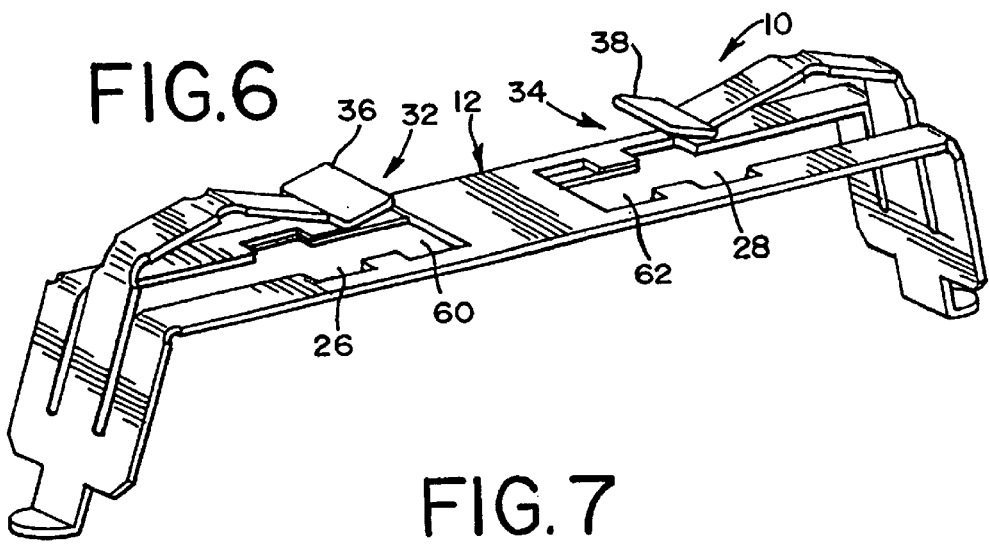
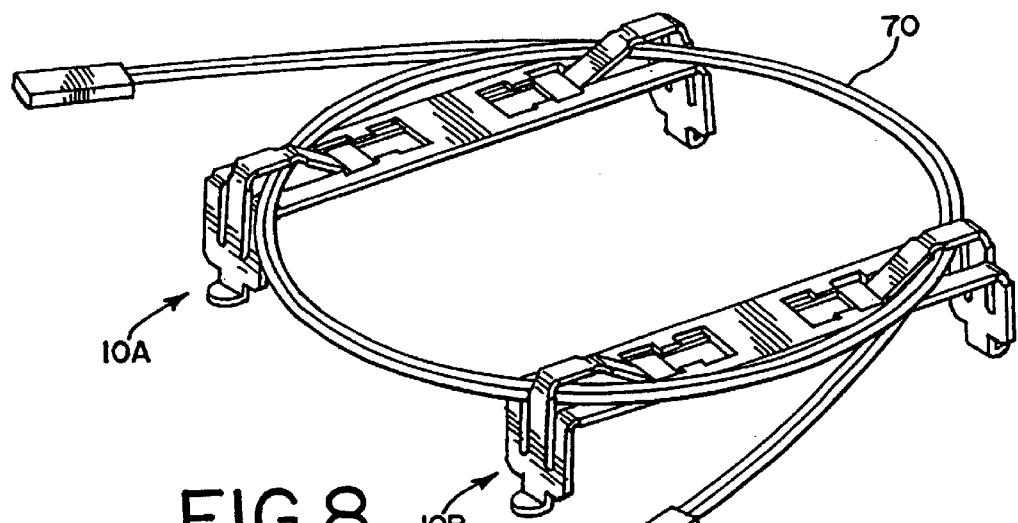
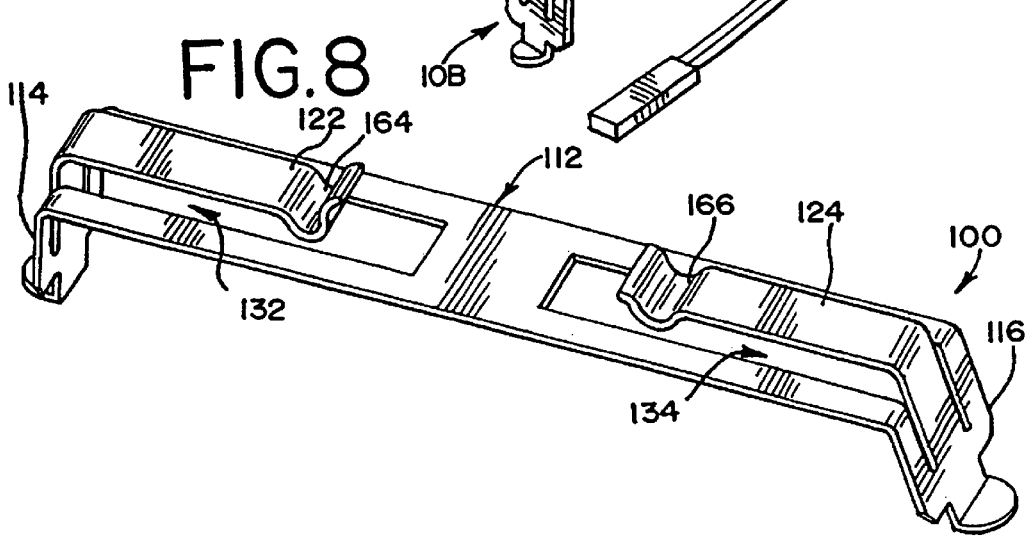

APPARATUS AND METHOD FOR HARNESSING OPTICAL FIBER TO A CIRCUIT BOARD

This is a division of U.S. application Ser. No. 10/001,103, filed Nov. 2, 2001, now U.S. Pat. No. 6,621,714.

FIELD OF THE INVENTION

This invention relates generally to the field of mechanical fasteners for printed circuit board applications and, in particular, to a means and method for harnessing or retaining optical fiber to a printed circuit board or the like.

BACKGROUND OF THE INVENTION

It is conventional to process or route information to and from many types of electronic devices via fiber optic cables, especially when large amounts of data or large numbers of signals need to be transmitted. Typically, the electronic devices include printed circuit boards with various components used to process the signals or perform needed operations. The components may include typical electronic and opto-electronic devices such as transceivers and so on. Typically, one end of a fiber optic cable is fastened to the circuit board by a connector that allows communication with an incoming or external fiber optic cable. A length of fiber optic cable may then extend from the connector to a device attached to the circuit board and thus permit data transmission therebetween.

However, fiber optic cable has physical limitations, notably the bending it can withstand without failure. The limitation on the bending that a fiber optic cable can withstand prior to failure is known as the minimum bend radius. Due to this physical limitation, devices have been created to manage or harness fiber optic cable to a printed circuit board in such a manner as to prevent over bending of the fiber optic cable and to prevent entanglement of the cable with adjacent components or boards, especially during installation of the board. One such harnessing or retaining device is a retaining eye loop. This prior art device resembles a ring mounted upon a post. The post includes an arrow-shaped connector or head portion opposite the ring, which, when inserted through an opening in a circuit board, expands on the far side of the board and holds the retaining device in place. Examples of such snap leg latches are shown in FIGS. 1 and 2 of U.S. Des. Pat. No. 278,143 (see also, U.S. Pat. Nos. 5,281,149, 5,255,159, and 6,058,579).

However, a disadvantage of such a retaining device is the difficulty of insertion of the connector portion, which can damage or break the circuit board. Further, the extent to which the retaining device extends outwardly from the circuit board, front and back, when installed, can increase the effective thickness of the circuit board, interfere with installation and damage adjacent components.

Accordingly, it would be desirable to provide an apparatus and method of providing improved retension of fiber optic cable to a circuit board, or the like, which overcomes the disadvantages described above.

SUMMARY OF THE INVENTION

One aspect of the present invention provides a clip apparatus for providing retension of fiber optic cable to a circuit board. The clip for retaining a length of fiber optic cable to a circuit board includes a body portion. The body portion of the apparatus includes at least a pair of spaced legs extending from the body portion, each of the legs is adapted to be received in a mounting opening formed in the PC board. Each of the spaced legs includes a foot portion adapted for securing the body to the circuit board and at least a pair of spaced arms extend from the body portion defining a slot between the arm and the body portion for receiving and retaining a portion of the length of fiber optic cable. The arms are spaced a distance from each other for retaining the fiber optic cable in an arc having a radius greater than a minimum bend radius of the fiber optic cable.

Another aspect of the invention provides a PC board and retaining clip assembly for retaining a length of fiber optic cable thereto, including a PC board including two pair of mounting openings. A pair of retaining clips are attached to the PC board. Each of the clips includes a body portion with a pair of spaced legs inserted into the pair of mounting openings. Each of the clips includes a pair of spaced arms. Each of the arms defines a slot with the body portion and a length of optic cable is retained in the slots of the pair of retaining clips.

Anther aspect of the invention provides a method of operation of a retention clip adapted to be mounted directly to a PC board for retaining a length of fiber optic cable on the PC board, including providing a first and second pair of openings through the PC board in a spaced apart configuration. Pressure is applied to a first pair of legs on a first retention clip such that the first pair of legs may be inserted through the first pair of openings on the PC board. Pressure is released from the first pair of legs to retain the first clip to the PC board. Pressure is applied to a second pair of legs on a second retention clip such that the second pair of legs may be inserted through the second pair of openings on the PC board and retained thereto. Pressure is released from the second pair of legs to retain the second clip to the PC board and the length of fiber optic cable is secured to the first and second retention clips in a radius greater than a minimum bend radius of the fiber optic cable.

In yet another aspect of the method of the present invention the securing the length of fiber optic cable may include providing a first pair of slots to the first retention clip, providing a second pair of slots to the second retention clip, inserting a first portion of the length of the fiber optic cable into the first pair of slots, inserting a second portion of the length of the fiber optic cable into the second pair of slots and closing the first and second pair of slots.

Another aspect of the present invention provides a clip including a body portion. The body portion includes a pair of spaced first and second legs extending in a first direction from the body portion and a pair of spaced arms extending in a second direction from the body portion. The second direction is opposite from the first direction. The arms define a slot with the body portion. The arms may further include means for locking a distal end of each the arms to the body portion.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 is a perspective view of one embodiment of a clip that is made in accordance with the invention for retaining fiber optic cable to a PC board;

FIG. 2 is a top view of the clip of FIG. 1;

FIG. 3 is a side view of the clip of FIG. 1 installed on a PC board;

FIG. 4 is a side view of the clip of FIG.;

FIG. 5 is an end view of the clip of FIG. 1 with the arms engaged with the body portion;

FIG. 6 is a perspective view of another embodiment of a clip according to the present invention;

FIG. 7 is a perspective view of a pair of clips according to one embodiment of the present invention retaining a length of fiber optic cable; and FIG. 8 is another embodiment of a clip of the present invention.

DETAILED DESCRIPTION OF THE PRESENTLY PREFERRED EMBODIMENTS

As shown in FIGS. 1–5, one embodiment of an apparatus for holding fiber optic cable to a printed circuit (PC) board, or the like is illustrated generally at 10. The apparatus 10, which may be a clip, harness, spring assembly, retainer or the like, may include a body portion generally indicated at 12. In general, formed from or attached to the body portion 12 may be a pair of spaced legs 14, 16 for holding the apparatus 10 to a PC board and a pair of arms 22, 24 for retaining a length of fiber optic cable.

The clip body portion 12 can be constructed of a spring steel material by stamping, punching or any suitable method. It will be understood that the clip may be formed of any suitable resilient material such as, for example, metal or plastic, which may tend to spring back into shape after being bent or biased. The clip may be formed from a single strip or blank of material. In the alternate, the clip may be formed from more than a single piece of material.

In the embodiment shown, the clip apparatus 10 may be formed from a single blank or strip of material. In such a case, the legs 14, 16 and arms 22, 24 and other elements of the apparatus are defined by separating the elements from the strip of material in one or more pressing, stamping or other suitable operation. In the case of arms 22, 24 being separated from the body 12, slots or openings 26, 28 may be left in the body 12. Of course, other methods may be used to form the body 12, legs 14, 16 and arms 22, 24 of clip apparatus 10, such as, for example, welding, gluing, thermoforming, molding and so on.

The body portion 12 may include a pair of legs 14, 16, formed at an angle from the body 12. Each leg may include one, two or more spans of material (for example, a pair of spans shown at 16A, 16B) attached to the body portion. The legs 14, 16 may be bent into position or otherwise formed at an angle from the body 12.

Each leg 14, 16 may include a respective foot 18, 20 formed at an angle from the legs. The feet 18, 20 may have a tab, flange, or lip shape or flattened extensions of the leg or the like. In the illustrated embodiment, the feet 18, 20 are formed essentially parallel to the axis of the body by bending or any suitable method. In this manner, as will be explained more fully herein, the legs 14, 16 and feet 18, 20 can hold the clip 10 to a PC board (not shown) when installed.

A pair of arms 22, 24 extend from the body portion 12. The arms 22, 24, as shown in the illustrated embodiment, may extend from an attached position adjacent the outer edges of the body portion 12 or the legs 14, 16. In the alternate, the arms may extend (not shown) from a central portion 30 of the body 12 as long as the spacing is such that the minimum radius of the cable (see FIG. 7) is maintained.

Further, it is contemplated that the arms 22, 24 may be spaced apart from the body portion 12 in a direction above or below the body 12. In other words, while the embodiment illustrated shows the arms 22, 24 spaced or extending from the body 12 in an opposite direction from that of the legs 14, 16, i.e., "over" the body, the arms 22, 24 might be positioned or formed "under" the body as well. The notch, channel or space 32, 34 between the body 12 and each respective arm serves to hold the fiber optic cable in position, for example, in a coiled configuration (see FIG. 7).

The free ends of each arm 22, 24 may include a tab feature or widened end 36, 38, which when inserted into slots 26, 28 of body 12, catches with the adjacent body portion and forms a closed feature of the clip 10. In this manner, a length or coil of cable can be securely held to the clip. It will be understood that the tab end 36, 38 when separated from body 12 during manufacture will be approximately the transverse width of the opening 26, 28 from which they were formed. When securing the tab portions 36, 38 of the arms 22, 24 to body 12 the tabs may be pressed through the openings at a wide point (from which the tabs originated). The tabs 36, 38 will tend to spring back slightly and become fastened under the body 12 adjacent a narrower portion of the opening and thus preventing opening of the slots or notches 32, 34.

The clip 10 may be mounted on a circuit board such as the circuit board 50 shown in FIG. 3. Those of ordinary skill in the art will appreciate that the size, shape and configuration of the clip may vary depending upon the particular application. In addition, the clip as illustrated may preferably be used in pairs, for example, and further, may be used in a parallel configuration to secure a coil of cable at a plurality (e.g., four) of spaced points about the coil. The pair of clips may be formed as a single unit (not shown) to provide the same or substantially the same benefits of the pair of clips. It will be understood that a coil may preferably be supported at a number of points spaced substantially equally apart. However, other arrangements or configurations are contemplated dependent upon the particular application.

Referring to FIG. 3, the circuit board 50 may preferably be a planar member and may preferably include an upper or first side 52, a lower or back side 54, and a plurality of mounting openings 56, 58 formed therein. The circuit board 50 may preferably be any conventional printed circuit board. The leg portions 14, 16 extend through the openings 56, 58. The feet 18, 20 may be positioned against the back side 54 of the board 50 and may be held in position by the spring bias of the legs 14, 16. The feet 18, 20 can function to prevent the clip 10 from becoming easily detached from the board 50.

Referring to FIG. 5, the clip 10 is shown with the tabs 36, 38 of the arms 22, 24 engaged with the body 12 to close openings or slots 32, 34.

As shown in FIG. 1, legs 14, 16 may extend outward angled to a position substantially perpendicular from the body 12. The legs 14, 16 are installed into suitable mounting holes in a PC board by hand or machine by first squeezing together, as shown in FIG. 3 and inserting the legs into the mounting holes. Release of the legs 14, 16 permits the legs to spring or flex outwardly and secure the clip to the PC board 50 as shown in FIG. 4, by contacting the edges of the board opening. Insertion of the legs 14, 16 through the holes causes insertion of the feet 18, 20 into a position extending below the PC board surface. An upper surface of the feet 18, 20 is positioned co-planar with the underside of the PC board. Releasing the legs 14, 16 causes the feet to come into contact with the underside of the PC board 50 and prevent the clip from becoming detached and removed therefrom.

As shown in FIG. 7, a coil of cable may be inserted into the notches 32, 34. When the tabs are captured or pressed into engagement with the sides of the openings 26, 28 the cable is held in place to the clip or clips (see FIG. 7).

Referring to FIG. 6, another embodiment of the present invention is illustrated. The elements of the embodiment shown in FIGS. 1–5 that are the same as the elements in the embodiment shown in FIGS. 6–7 are identified with the same reference characters. Clip 10 includes body 12, which may include two thicknesses or layers of material. Thus, in one embodiment, a second strip or additional layer of material may be affixed to the clip body 12 to effectively narrow the openings 26, 28. In this manner, the tab portions 36, 38 are retained in a narrowed portion 60, 62 of openings 26, 28 when the tabs are depressed into the body (into a position similar to that shown in FIG. 5), thereby closing notches 32, 34. In operation, the tab portions 36, 38 are inserted through the openings 26, 28 of the body 12 and will tend to catch the underside of the body at the narrow portions 60, 62, thus preventing opening of the slots 32, 34.

Referring to FIG. 7, a coil of fiber optic cable 70 is shown held by a pair of clips 10A, 10B. The clips may be arranged in a substantially parallel configuration and together cooperate to prevent the coil from being tangled, bent or otherwise forced into a smaller than minimum bend radius.

Referring to FIG. 8, another embodiment of the present invention is illustrated. A clip, generally shown at 100, includes clip body 112. The body may have extending therefrom or attached thereto at an angle a pair of legs 114, 116. In one embodiment, a pair of arms 122, 124 may extend from the clip body 112 on a side of the body generally opposite from that of the legs. Between the arms 122, 124 and the body 112 slots or notches 132, 134 are defined. Adjacent a terminal portion of the arms 122, 124 a constricting feature 164, 166 may be formed in each arm to constrict or close the notches 132, 134. In use, the arms 122, 124 are spread apart from the body 112 or opened to permit insertion of a length or coil of cable into the notches 132, 134. Release of the arms 122, 124 cause the constricting features 164, 166 to close or obstruct the mouth of the notches and thus function to prevent release of the cable therefrom. As in the above embodiments, the clip 100 may be used in pairs to hold the coil of cable (not shown) at four points.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A PC board and retaining clip assembly for retaining a length of fiber optic cable thereto, comprising:

a PC board including two pair of mounting openings;

a pair of retaining clips, each of the clips including a body portion including a pair of spaced legs being inserted into the pair of mounting openings, each of the clips including a pair of spaced arms, each of the arms defining a slot with the body portion; and a length of optic cable retained in the slots of the pair of retaining clips.

2. A method of operation of a retention clip adapted to be mounted directly to a PC board for retaining a length of fiber optic cable on the PC board, comprising:

providing a first and second pair of openings through the PC board in a spaced apart configuration;

applying pressure to a first pair of legs on a first retention clip such that the first pair of legs may be inserted through the first pair of openings on the PC board;

releasing pressure from the first pair of legs to retain the first clip to the PC board;

applying pressure to a second pair of legs on a second retention clip such that the second pair of legs may be inserted through the second pair of openings on the PC board and retained thereto;

releasing pressure from the second pair of legs to retain the second clip to the PC board; and securing the length of fiber optic cable to the first and second retention clips in a radius greater than a minimum bend radius of the fiber optic cable.

3. The method of claim 2 wherein securing the length of fiber optic cable comprises:

providing a first pair of slots to the first retention clip;

providing a second pair of slots to the second retention clip;

inserting a first portion of the length of the fiber optic cable into the first pair of slots;

inserting a second portion of the length of the fiber optic cable into the second pair of slots; and closing the first and second pair of slots.

\* \* \* \* \*